United States Patent
Barthelmess et al.

(10) Patent No.: US 7,361,970 B2
(45) Date of Patent: Apr. 22, 2008

(54) METHOD FOR PRODUCTION OF A BURIED STOP ZONE IN A SEMICONDUCTOR COMPONENT AND SEMICONDUCTOR COMPONENT COMPRISING A BURIED STOP ZONE

(75) Inventors: Reiner Barthelmess, Soest (DE); Anton Mauder, Kolbermoor (DE); Franz-Josef Niedernostheide, Münster (DE); Hans-Joachim Schulze, Ottobrunn (DE)

(73) Assignee: Infineon Technologies AG (DE)

( * ) Notice: Subject to any disclaimer, the term of this patent is extended or adjusted under 35 U.S.C. 154(b) by 336 days.

(21) Appl. No.: 11/083,914

(22) Filed: Mar. 18, 2005

(65) Prior Publication Data

US 2005/0280076 A1 Dec. 22, 2005

Related U.S. Application Data

(63) Continuation of application No. PCT/EP03/09494, filed on Aug. 27, 2003.

(30) Foreign Application Priority Data

Sep. 20, 2002 (DE) .................. 102 43 758

(51) Int. Cl.
 *H01L 31/0248* (2006.01)
(52) U.S. Cl. .............. 257/607; 257/617; 257/E33.044
(58) Field of Classification Search .............. 257/607, 257/617
 See application file for complete search history.

(56) References Cited

U.S. PATENT DOCUMENTS

| 4,985,741 | A | 1/1991 | Bauer et al. .................. 357/34 |
| 4,987,087 | A | 1/1991 | Voss .............................. 437/6 |
| 5,569,941 | A | 10/1996 | Takahashi ................... 257/133 |
| 6,091,108 | A | 7/2000 | Harris et al. ................ 257/339 |
| 6,190,970 | B1 | 2/2001 | Liao et al. .................. 438/269 |
| 6,791,121 | B2 | 9/2004 | Nemoto et al. ............ 257/109 |
| 6,847,091 | B2 | 1/2005 | Deboy et al. ............... 257/495 |

FOREIGN PATENT DOCUMENTS

| DE | 44 29 284 A1 | 2/1996 |
| DE | 100 25 567 A1 | 12/2001 |
| DE | 10207522 A | 9/2002 |
| DE | 102 14 176 A1 | 10/2003 |

(Continued)

OTHER PUBLICATIONS

Silber D., et al., "Improved Dynamic Properties of GTO-Thryistors and Diodes by Proton Implantation", International Electron Devices Meeting, Washington, Dec. 1-4, 1985, Technical Digest in Electron Device Meeting, 1985, IEEE, New York, NY USA, Dec. 1985 (Dec. 1985), pp. 162-165.

(Continued)

*Primary Examiner*—Evan Pert
(74) *Attorney, Agent, or Firm*—Coats & Bennett, P.L.L.C.

(57) ABSTRACT

A method for the production of a stop zone in a doped zone of a semiconductor body having a first side and a second side, comprises the following method steps:
 applying a mask having cutouts to one of the sides of the semiconductor body,
 irradiating the side having the mask with proton radiation,
 carrying out a heat treatment method in order to produce hydrogen-induced donors in the semiconductor body.

13 Claims, 5 Drawing Sheets

FOREIGN PATENT DOCUMENTS

| | | |
|---|---|---|
| EP | 0405422 A | 1/1991 |
| EP | 0 497 290 A2 | 8/1992 |
| EP | 0 574 049 A2 | 12/1993 |
| EP | 0594049 A | 4/1994 |
| EP | 1 030 375 A1 | 8/2000 |
| WO | 95/07548 | 3/1995 |

OTHER PUBLICATIONS

Ohmura y et al.; Electrical Properties of N-typ Si Layers Doped with Proton Bombardment induced Shallow Donors, Solid State Communications, Oxford, GB, vol. 11, No. 1, Jul. 1, 1972, pp. 263-266.

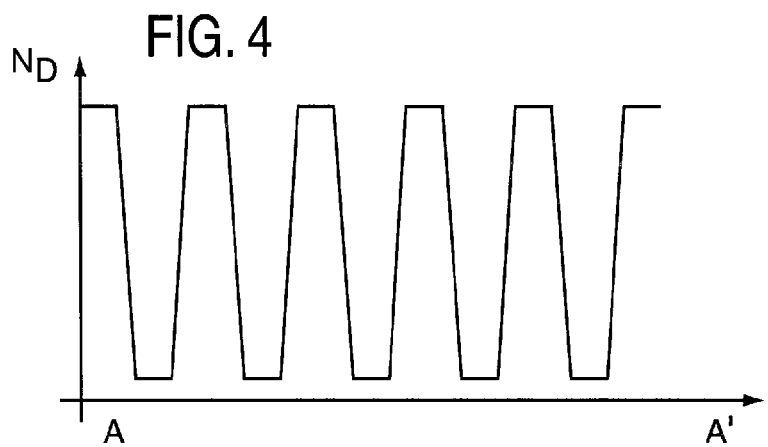
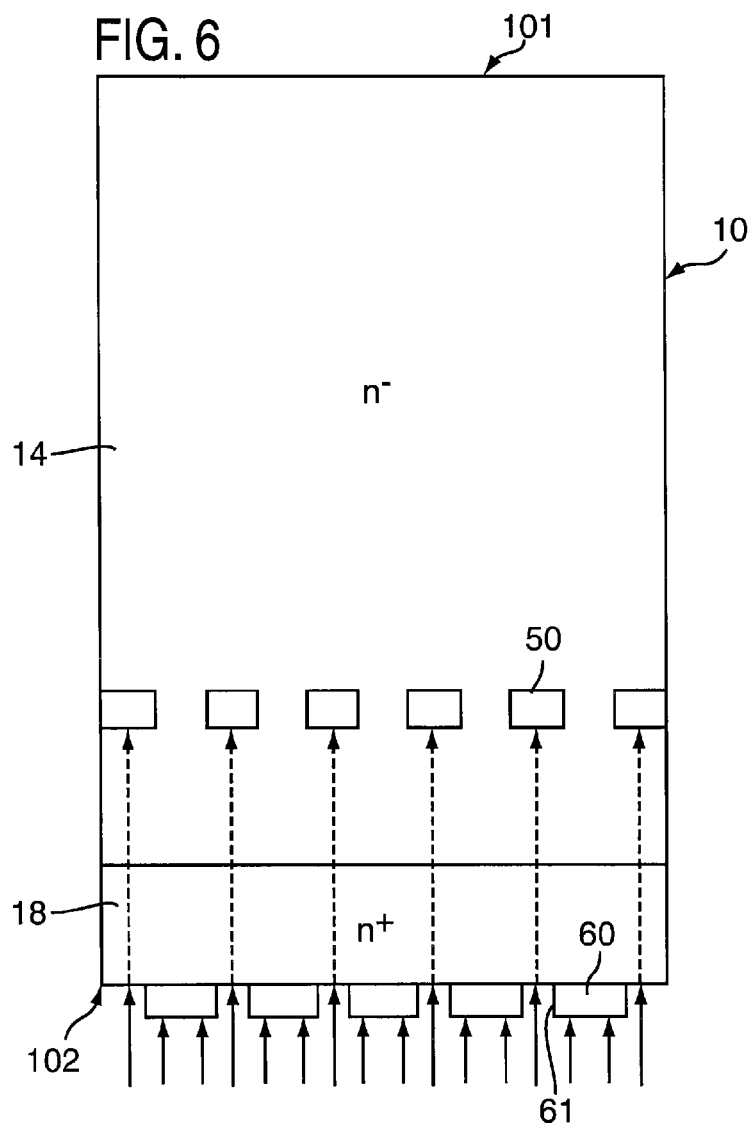

METHOD FOR PRODUCTION OF A BURIED STOP ZONE IN A SEMICONDUCTOR COMPONENT AND SEMICONDUCTOR COMPONENT COMPRISING A BURIED STOP ZONE

CROSS REFERENCE TO RELATED APPLICATION

This application is a continuation of copending International Application No. PCT/EP03/09494 filed Aug. 27, 2003 which designates the United States, and claims priority to German application no. 102 43 758.0 filed Sep. 20, 2002.

TECHNICAL FIELD OF THE INVENTION

The present invention relates to a semiconductor component, in particular a vertical power semiconductor component, having a doped first semiconductor zone of a first conduction type, a doped second semiconductor zone of a second conduction type, which adjoins the first semiconductor zone and is doped more weakly than the first semiconductor zone, a doped third semiconductor zone, which adjoins the second semiconductor zone and is doped more heavily than the second semiconductor zone.

BACKGROUND OF THE INVENTION

A semiconductor structure of this type is present both in vertical diodes and vertical transistors and in thyristors, the second, more weakly doped semiconductor zone serving as a drift path which, in the off-state case of the component, takes up the majority of the voltage present between the first and third semiconductor zones.

In diodes, the third semiconductor zone is of the same conduction type as the second semiconductor zone. The second semiconductor zone and the third semiconductor zone are usually n-doped, so that the first semiconductor zone forms the anode and the second semiconductor zone forms the cathode.

In power MOS transistors, a field effect structure is generally present in the region of the first semiconductor zone, which usually lies in the region of the front side of a semiconductor body, said field effect structure comprising a zone of the second conduction type (which is complementary to the doping of the first semiconductor zone), which is arranged in the first semiconductor zone, and a control electrode. The first semiconductor zone forms the so-called body zone of the component, and the complementarily doped zone arranged in the body zone forms the source zone or emitter zone. The control electrode or gate electrode extends, in a manner insulated from the semiconductor zones, from the source or emitter zone as far as the second semiconductor zone, the drift zone. The source zone or the emitter zone and the first semiconductor zone are usually short-circuited, so that a freewheeling diode (body diode) is connected in parallel with the power transistor.

If the power transistor is formed as a MOSFET (Metal Oxide Field Effect Transistor), then the third semiconductor zone is of the same conduction type as the second semiconductor zone or the drift zone and forms the drain zone of the component.

If the power transistor is formed as an IGBT (Insulated Gate Bipolar Transistor) or as a thyristor, then the third semiconductor zone is doped complementarily to the second semiconductor zone and forms the collector zone of the semiconductor component. In thyristors, the first zone is adjoined by a complementarily doped zone.

Diodes, MOSFETs, IGBTs and thyristors of this type are generally known.

EP 0405 200 A1 describes an IGBT of this type, for example, in the drift zone of which the source zone is preceded by a heavily doped zone of the same conduction type as the drift zone, and said heavily doped zone is intended to have the effect that holes injected into the drift zone from the p-doped drain zone do not reach the source zone but rather recombine in said heavily doped zone, which is constructed from a plurality of spaced-apart sections in one embodiment.

All of the components mentioned are subject to the problem that current chopping can occur during the turn-off of the component, that is to say during the transition of the component from a current-conducting to a blocking state. This refers to a process in which the current of the component falls extremely rapidly to very small values. Since the circuitry of such components means that parasitic inductances are unavoidably present, particularly in the leads, and the voltage in these inductances, as is known, is proportional to the derivative of the current, a rapid decrease in the current to very small values effects a high induced voltage that may lead to damage to the component. Furthermore, the appearance of abrupt current changes may be undesirable for specific applications, for example when using a diode as a freewheeling diode in a semiconductor component.

A very rapid fall in the current when the component turns off results from the fact that the second semiconductor zone is initially still flooded by charge carriers which are transported away from the second semiconductor zone, the drift zone, on account of a space charge zone propagating in a manner proceeding from the pn junction between the first and second semiconductor zones. As long as this transporting away of the "stored" charge carriers (plasma charge) lasts, a current which decreases slowly still flows through the connecting lines or to connected loads. As soon as the space charge zone occupies the entire semiconductor body and free charge carriers are no longer present, said current falls with a large temporal gradient to very small values.

In order to avoid this problem, it is known to make the dimensions of the second semiconductor zone as large as possible in the vertical direction of the semiconductor component, so that, during turn-off, charge carriers are subsequently supplied for as long as possible in order to ensure a "soft" turn-off, i.e. a slowest possible decay of the current. What is disadvantageous in this case is that the losses increase since, as the thickness of the drift zone increases, the forward resistance also increases.

DE 102 14 176.2 which has not yet been published, proposes a stop zone formed in sections for the purpose of obtaining a soft turn-off behavior, said stop zone having more heavily doped zones arranged at a distance from one another in the lateral direction of the semiconductor body.

SUMMARY OF THE INVENTION

It is an object of the present invention to provide an improved method for the production of such a semiconductor component comprising a stop zone formed in sections and a semiconductor component produced by means of such a method.

These objects can be achieved by a semiconductor component comprising a doped first semiconductor zone of a first conduction type, a doped second semiconductor zone of a second conduction type, which adjoins the first semiconductor zone and is doped more weakly than the first semiconductor zone, a doped third semiconductor zone of the second conduction type, which adjoins the second semiconductor zone and is doped more heavily than the second semiconductor zone, a stop zone of the second conduction type, which is arranged in the second semiconductor zone at a distance from the third semiconductor zone, the stop zone being doped more heavily than regions of the second semiconductor zone that surround the stop zone, the distance between the stop zone and the third semiconductor zone being less than the distance between the stop zone and the first semiconductor zone, and a stop zone formed in sections, the stop zone having a plurality of zones arranged laterally spaced apart from one another.

The object can also be achieved by a semiconductor component comprising a doped first semiconductor zone of a first conduction type, a doped second semiconductor zone of a second conduction type, which adjoins the first semiconductor zone and is doped more weakly than the first semiconductor zone, a doped third semiconductor zone of the first conduction type, which adjoins the first semiconductor zone and is doped more heavily than the second semiconductor zone, a stop zone of the second conduction type, which is arranged in the second semiconductor zone at a distance from the third semiconductor zone, the stop zone being doped more heavily than regions of the second semiconductor zone that surround the stop zone, the distance between the stop zone and the third semiconductor zone being less than the distance between the stop zone and the first semiconductor zone, a stop zone formed in sections, the stop zone having a plurality of zones arranged laterally spaced apart from one another, and a field effect structure comprising a zone of the second conduction type, which is arranged in the first semiconductor zone at a distance from the second semiconductor zone, and a control electrode formed in a manner insulated from the semiconductor zones.

The semiconductor component may have at least one field effect structure comprising a zone of the second conduction type, which is arranged in the first semiconductor zone at a distance from the second semiconductor zone, and a control electrode formed in a manner insulated from the semiconductor zones. The distance between the third semiconductor zone and the first semiconductor zone can be more than three times as large as the distance between the stop zone and the third semiconductor zone. The dimensions of the stop zone in the direction from the first to the third semiconductor zone can be significantly smaller than the dimensions of the second semiconductor zone in this direction.

The object can furthermore be achieved by a method for the production of a stop zone in a doped zone of a semiconductor body, which method comprises the following method steps of irradiating the semiconductor body with particle radiation in order to produce defects in the crystal lattice of the semiconductor body, and carrying out a diffusion step, during which the semiconductor body is exposed to an environment containing dopant atoms and during which dopant atoms are indiffused into the semiconductor body at an elevated temperature.

The zone of the semiconductor body can be n-doped, and the dopant atoms can be selenium or sulfur atoms. The zone of the semiconductor body can also be p-doped, and the dopant atoms can be aluminum atoms. The particle radiation can be a helium irradiation. The diffusion temperature may lie between 600° C. and 1000° C. The semiconductor body can be irradiated directly by means of the particle radiation. The semiconductor body can be irradiated by means of the particle radiation through a thin film. The semiconductor body can be irradiated through a mask that is partially impenetrable to the particle radiation.

The object can furthermore be achieved by a method for the production of a stop zone in a doped zone of a semiconductor body having a first side and a second side, the method comprising the following method steps of applying a mask having cutouts to one of the sides of the semiconductor body, irradiating the side having the mask with proton radiation, and carrying out a heat treatment method in order to produce hydrogen-induced donors in the semiconductor body.

The temperature and the duration of the heat treatment method can be chosen such that irradiation damage produced by the irradiation is largely annealed but essentially no diffusion of the introduced protons in the semiconductor body takes place. The heat treatment method can be an RTA method. The temperature during the heat treatment method may lie between 250° C. and 550° C., preferably between 400° C. and 500° C. The mask can be a metal diaphragm.

The object can also be achieved by a semiconductor component comprising a doped first semiconductor zone of a first conduction type, a doped second semiconductor zone of a second conduction type, which adjoins the first semiconductor zone and is doped more weakly than the first semiconductor zone, a doped third semiconductor zone, which adjoins the second semiconductor zone and is doped more heavily than the second semiconductor zone, and a stop zone of the second conduction type, which is arranged in the second semiconductor zone at a distance from the third semiconductor zone, the stop zone being doped more heavily than regions of the second semiconductor zone that surround the stop zone, the distance between the stop zone and the third semiconductor zone being less than the distance between the stop zone and the first semiconductor zone, the stop zone being formed in sections in such a way that it has a plurality of zones arranged laterally spaced apart from one another, and the doping of the stop zone being formed at least partly by hydrogen-induced donors.

The distance between the third semiconductor zone and the first semiconductor zone can be more than three times as large as the distance between the stop zone and the third semiconductor zone. The semiconductor component may have at least one field effect structure comprising a zone of the second conduction type, which is arranged in the first semiconductor zone at a distance from the second semiconductor zone, and a control electrode formed in a manner insulated from the semiconductor zones. The third semiconductor zone can be of the second conduction type. The third semiconductor zone can also be of the first conduction type. The dimensions of the stop zone in the direction from the first to the third semiconductor zone can be significantly smaller than the dimensions of the second semiconductor zone in this direction.

The method according to the invention for the production of a stop zone in a doped zone of a semiconductor body having a first side and a second side comprises applying a mask having cutouts to one of the sides of the semiconductor body, irradiating the side having the mask with proton radiation and carrying out a heat treatment method.

The method with the proton irradiation and the subsequent heat treatment gives rise to hydrogen-induced donors in the irradiated regions, which donors result from the irradiation-dictated defects and the implanted hydrogen atoms. The hydrogen itself is non-doping.

The position of the individual sections of the stop zone in the lateral direction of the semiconductor body in the doped semiconductor region is determined by the dimensions of the mask or of the cutouts in the mask, which masks the irradiation process. The position of said stop zones in the vertical direction of the semiconductor body is determined by the penetration depth of the protons into the semiconductor body, which is in turn dependent on the irradiation energy. By means of such proton radiation, it is possible to produce doped zones in depths of up to a few hundred μm proceeding from the irradiated side of the semiconductor body.

The temperature and the duration of the heat treatment method are preferably chosen such that irradiation damage which is produced by the irradiation and reduces the carrier lifetime is at least partly annealed. The vertical position of the regions into which protons are introduced can be set comparatively exactly by means of the irradiation energy. Well demarcated doped zones which form the sections of the stop zone can be produced through the choice of the heat treatment method.

Both an RTA method (RTA=Rapid Thermal Annealing) and continuous furnace processes are suitable as heat treatment methods.

The temperature during the heat treatment method lies between 250° C. and 550° C., preferably between 400° C. and 500° C. The duration is between 1 min and 250 min.

The mask for the partial proton irradiation may be a mask that is fixedly applied to one of the sides of the semiconductor body. The mask may also be a metal diaphragm positioned in front of that side of the semiconductor body or wafer (which has a multiplicity of contiguous semiconductor components) which is to be irradiated.

The semiconductor component according to the invention comprises a doped first semiconductor zone of a first conduction type, a doped second semiconductor zone of a second conduction type, which adjoins the first semiconductor zone and is doped more weakly than the first semiconductor zone, a doped third semiconductor zone, which adjoins the second semiconductor zone and is doped more heavily than the second semiconductor zone, and a stop zone of the second conduction type, which is arranged in the second semiconductor zone at a distance from the third semiconductor zone, the stop zone being doped more heavily than regions of the second semiconductor zone that surround the stop zone, the distance between the stop zone and the third semiconductor zone being less than the distance between the stop zone and the first semiconductor zone. In this case, the stop zone is formed in sections in such a way that it comprises a number of doped zones arranged at a distance from one another in the lateral direction of the semiconductor body, said doped zones containing hydrogen-induced donors. More weakly doped zones of the second semiconductor zone are arranged between the zones of the stop zone that are arranged laterally spaced apart from one another. These more weakly doped zones of the second semiconductor zone form "passages" for charge carriers in the second semiconductor zone.

When the semiconductor component according to the invention turns off, if the space charge zone reaches the stop zone, charge carriers are subsequently supplied from the more heavily doped stop zone and primarily from the region lying between the stop zone and the third zone and thus still cause a current flow for a longer time duration than would be the case without a stop zone and thereby effect a "soft" turn-off behavior.

The stop zone does not significantly increase the forward resistance and is advantageous particularly in such components which have a low doping of the second semiconductor zone or the drift zone in order to achieve a good stability toward cosmic radiation.

The stop zone is arranged in the second semiconductor zone approximately where free charge carriers—which are depleted proceeding from the pn junction between the first and second semiconductor zones—are present in the component without a stop zone at the end of the depletion phase. This is implicitly connected with the position of the stop zone. The stop zone is closer to the third semiconductor zone than to the first semiconductor zone, that is to say that the distance between the stop zone and the third semiconductor zone is less than the distance between the stop zone and the first semiconductor zone.

Preferably, the distance between the third semiconductor zone and the first semiconductor zone is more than three times as large as the distance between the stop zone and the third semiconductor zone. The dimensions of the stop zone in a direction from the first to the third semiconductor zone, that is to say in the vertical direction of the component, are significantly smaller than the dimensions of the second semiconductor zone in this direction.

The semiconductor component may be formed as a diode, in which case, in the case of a p-doped first semiconductor zone, this first semiconductor zone forms the anode and the third semiconductor zone, which is then n-doped, forms the cathode.

The semiconductor component may also be formed as a MOS transistor, at least one field effect structure then being present, said field effect structure comprising a zone of the second conduction type, which is arranged in the first semiconductor zone at a distance from the second semiconductor zone, and a control electrode formed in a manner insulated from the semiconductor zones.

In this case, the first semiconductor zone forms the body zone, and the zone of the second conduction type which is arranged in the body zone forms the source zone or the emitter zone. In the case of a MOSFET, the doping type of the third semiconductor zone corresponds to the doping type of the second semiconductor zone or the drift zone, the third semiconductor zone forming the drain zone of the MOSFET. In the case of an IGBT, the doping type of the third semiconductor zone is complementary to the doping type of the second semiconductor zone or the drift zone, the third semiconductor zone forming the collector zone of the IGBT.

Moreover, the component may, of course, also be formed as a thyristor.

BRIEF DESCRIPTION OF THE DRAWINGS

The present invention is explained in more detail below in exemplary embodiments with reference to figures, in which:

FIG. 4 shows by way of example a doping profile in the stop zone along the section line A-A' depicted in FIGS. 1 to 3, FIG. 6 shows a method step for the production of a buried stop zone in a semiconductor component.

DESCRIPTION OF THE INVENTION

In the figures, unless specified otherwise, identical reference symbols designate identical parts and regions with the same meaning.

Figure 1:
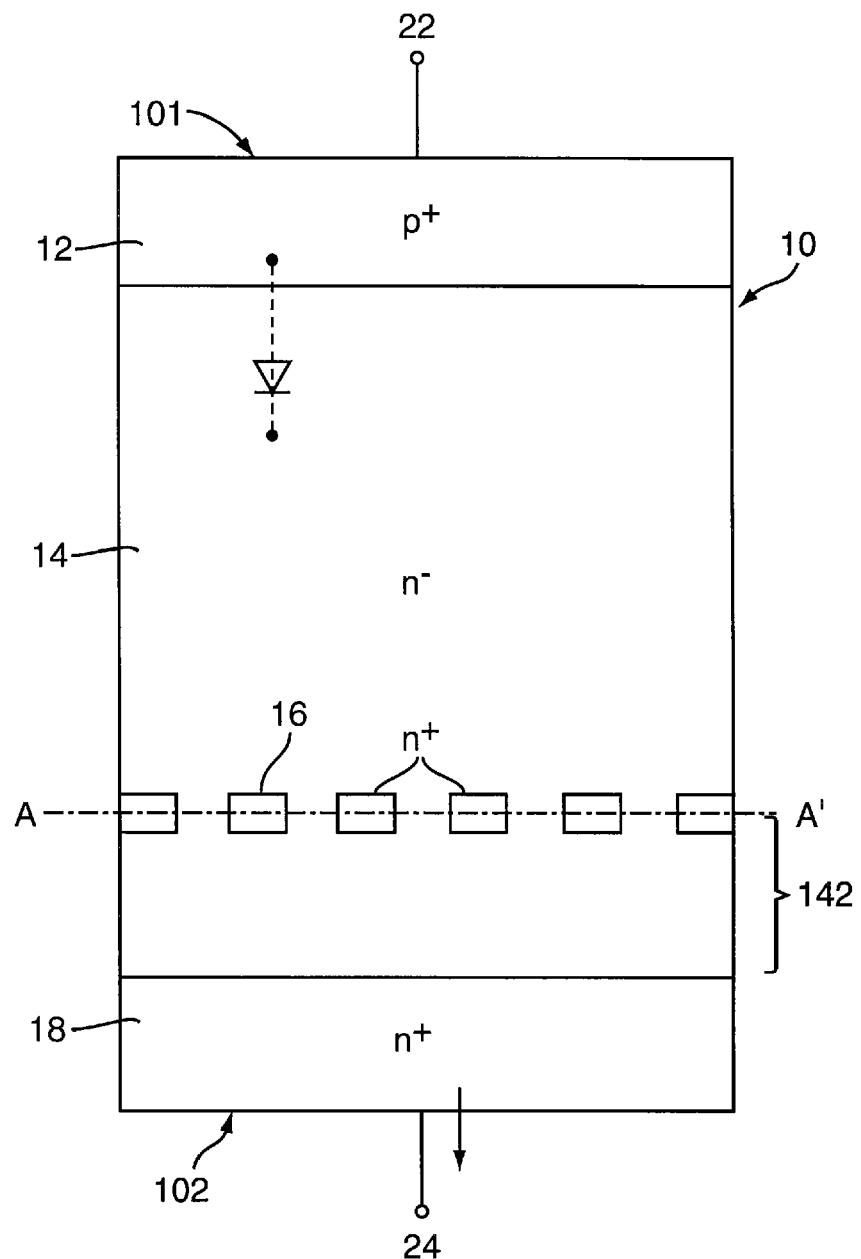
FIG. 1 shows a semiconductor component according to the invention formed as a diode.

FIG. 1 shows the detail from a semiconductor body 10 of a vertical semiconductor component according to the invention formed as a diode. The component has a p-doped first semiconductor zone 12, which is arranged in the region of the front side 101 of the semiconductor body 10 and is adjoined by a weakly n-doped second semiconductor zone 14 in the vertical direction. Said second semiconductor zone 14 is adjoined by a heavily n-doped third semiconductor zone 18 in the vertical direction, said third semiconductor zone forming the rear side 102 of the semiconductor body 10.

According to the invention, a stop zone 16 is present in the second semiconductor zone 14 at a distance from the third semiconductor zone 18, which stop zone is doped more heavily than the remaining region of the second semiconductor zone 14 and is of the same conduction type as the remaining region of the second semiconductor zone 14. The stop zone 16 is arranged at a distance from the third semiconductor zone 18 and at a distance from the first semiconductor zone 12, the distance between the stop zone 16 and the third semiconductor zone 18 being less than the distance between the stop zone 16 and the first semiconductor zone 12.

The stop zone 16 comprises a plurality of partial sections arranged at a distance from one another in the lateral direction of the component, so that more weakly n-doped zones of the second semiconductor zone 14 are present between the individual heavily n-doped partial zones, and form passages for charge carriers.

In addition, the stop zone is n-doped, this n-type doping being formed at least partly by hydrogen-induced donors.

In the case of the component formed as a PIN diode in accordance with FIG. 1, the first semiconductor zone 12 serves as an anode zone, and a terminal 22—depicted only schematically—correspondingly forms the anode terminal. The second semiconductor zone 14 serves as a drift path or drift zone which, in the off-state case, takes up a substantial part of the reverse voltage present, and the third semiconductor zone 18, which, in the case of the diode, is of the same conduction type as the drift path 14 but complementary to the doping of the first semiconductor zone 12, serves as a cathode zone, and a terminal 24—depicted only schematically—correspondingly serves as a cathode terminal. The electrical equivalent circuit diagram of the component is depicted by broken lines in the structure in FIG. 1.

The functioning of the component according to the invention, and in particular the functioning of the stop zone 16, is briefly explained below.

When a positive voltage is applied between the anode terminal 22 and the cathode terminal 24, the component is operated in the forward direction, electrons and holes being injected into the drift zone 14 and "flooding" the latter. The component turns off upon polarity reversal of the voltage, i.e. when a positive voltage is applied between the cathode terminal 24 and the anode terminal 22. A space charge zone in this case propagates in a manner proceeding from the anode zone 12 and the cathode zone 18 and causes the free charge carriers to flow away from the drift zone 14. These free charge carriers that are still present in the drift zone 14 ensure that the current that can be observed at the connecting terminals 22, 24 does not break off abruptly with the polarity reversal of the voltage, but rather is still maintained for a certain time duration until the free charge carriers have flowed away from the drift zone 14.

The stop zone 16 is arranged in such a way that as the space charge zone propagates, free charge carriers are present to the very end, in particular in the zone 142 between the stop zone 16 and the emitter 18. Before the component turns off completely, i.e. the current that can be observed at the connecting terminals 22, 24 falls to very small values (reverse current), free charge carriers are also subsequently supplied from the more heavily doped stop zone 16 and the zone 142. Since more charge carriers are supplied from the proposed structure with the stop zone 16 than in the case of a component in which a buried stop zone of this type is not present, the current decreases more slowly in the case of the semiconductor component according to the invention. In particular the fall of the current shortly before the space charge zone has reached its maximum extent is smaller in the case of the semiconductor component according to the invention than in the case of conventional components of this type. Induced voltages in parasitic inductances, for example the leads, which are proportional to the derivative of the current are therefore reduced in the case of the component according to the invention compared with conventional components of this type.

Forming the stop zone 16 in sections with more weakly doped regions lying in between ensures that "passages" for free charge carriers are present through the more weakly doped regions in order that the charge carrier current in the drift zone 14 is not influenced, or is influenced only to an insignificant extent, by the presence of the stop zone.

As already explained, the stop zone is arranged in a region of the drift zone which is closer to the n-doped third semiconductor zone 18 than to the p-doped first semiconductor zone 12. The distance between the third semiconductor zone 18 and the first semiconductor zone 12 is preferably more than three times as large as the distance between the stop zone 16 and the third semiconductor zone 18.

Figure 2:
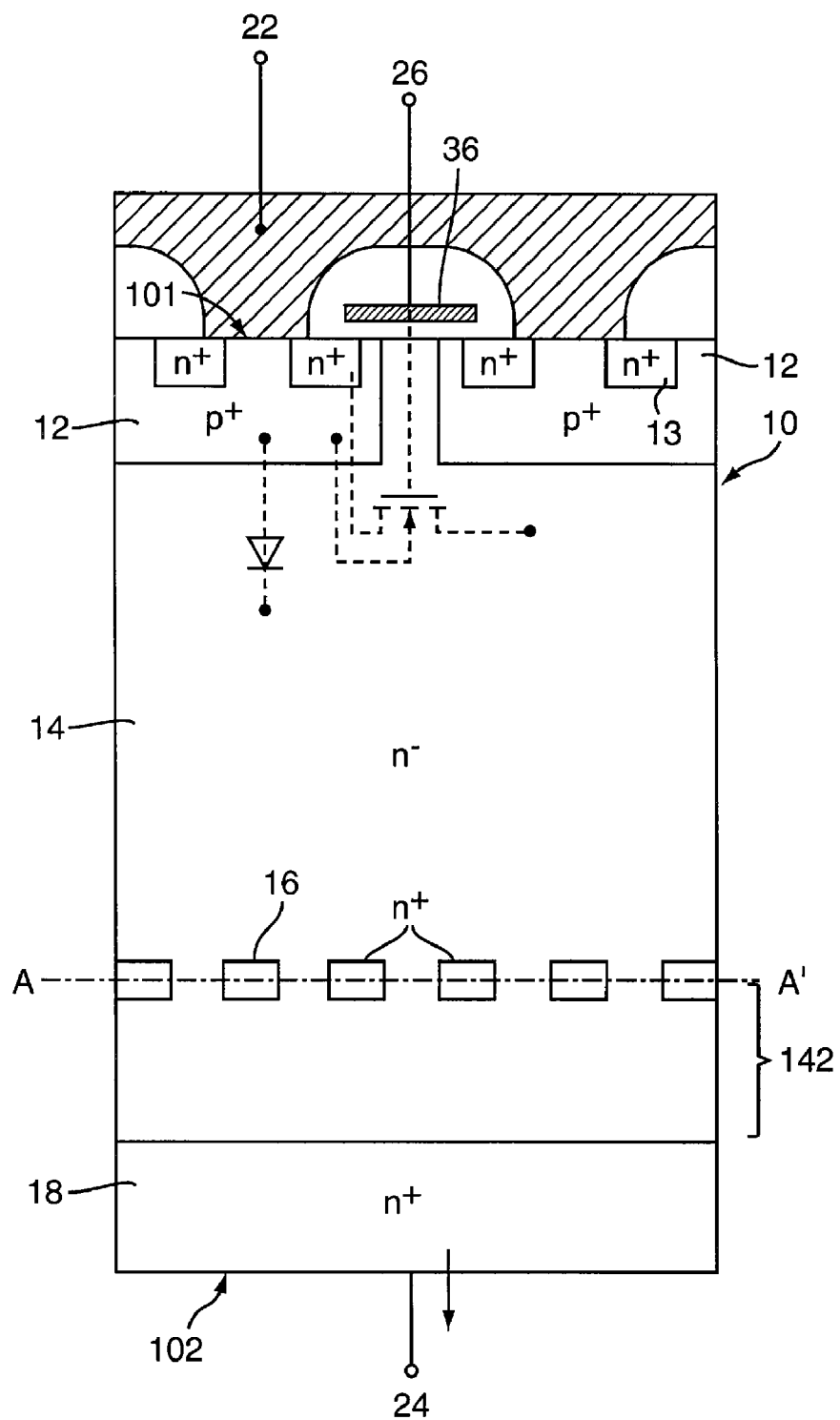
FIG. 2 shows a semiconductor component according to the invention formed as a MOSFET.

FIG. 2 shows a semiconductor component according to the invention formed as a MOSFET, which differs from the diode in accordance with FIG. 1 by virtue of the fact that a field effect structure is present in the region of the front side of the semiconductor component. Said field effect structure comprises heavily n-doped source zones 13 in the first semiconductor zone 12, which serves as a body zone, and also at least one gate electrode 36, which is insulated from the semiconductor body 10, for forming a conductive channel between the source zone 13 and the drift zone 14 upon application of a suitable drive potential. In the case of the MOSFET, the drift zone 14 extends in sections between the heavily p-doped body zones 12 as far as the front side 101 of the semiconductor body, above which the gate electrode 36 is arranged.

In an alternative design (not specifically illustrated) of the MOSFET as a trench MOSFET, the gate electrode is arranged in a trench extending into the semiconductor body in the vertical direction and extends right into the drift zone, so that the drift zone does not reach as far as the front side of the semiconductor body 10 in the case of this exemplary embodiment.

The body zone 12 and the source zone 13 are short-circuited by a connecting electrode 22, which forms the source electrode of the component. The heavily n-doped semiconductor zone 18 in the region of the rear side 102 of the semiconductor component serves as a drain terminal. The gate electrode 36 is contact-connected by a gate terminal 26 illustrated schematically.

According to the invention, this semiconductor component also contains a stop zone 16 which is doped more heavily than the second semiconductor zone 14 and ensures a "soft turn-off" of the body diode. The function of this body diode corresponds to the function of the diode illustrated in FIG. 1, this diode being forward-biased if a positive voltage is present between the source terminal and the drain terminal of the MOSFET. This diode, the circuit symbol of which is depicted by broken lines, serves as a freewheeling diode that turns on when the MOSFET is in the off state and a positive source-drain voltage is present. The special arrangement of the stop zone 16 ensures that the freewheeling current flowing through the body diode does not decrease abruptly upon polarity reversal of the voltage, i.e. when a positive drain-source voltage is present.

Figure 3:
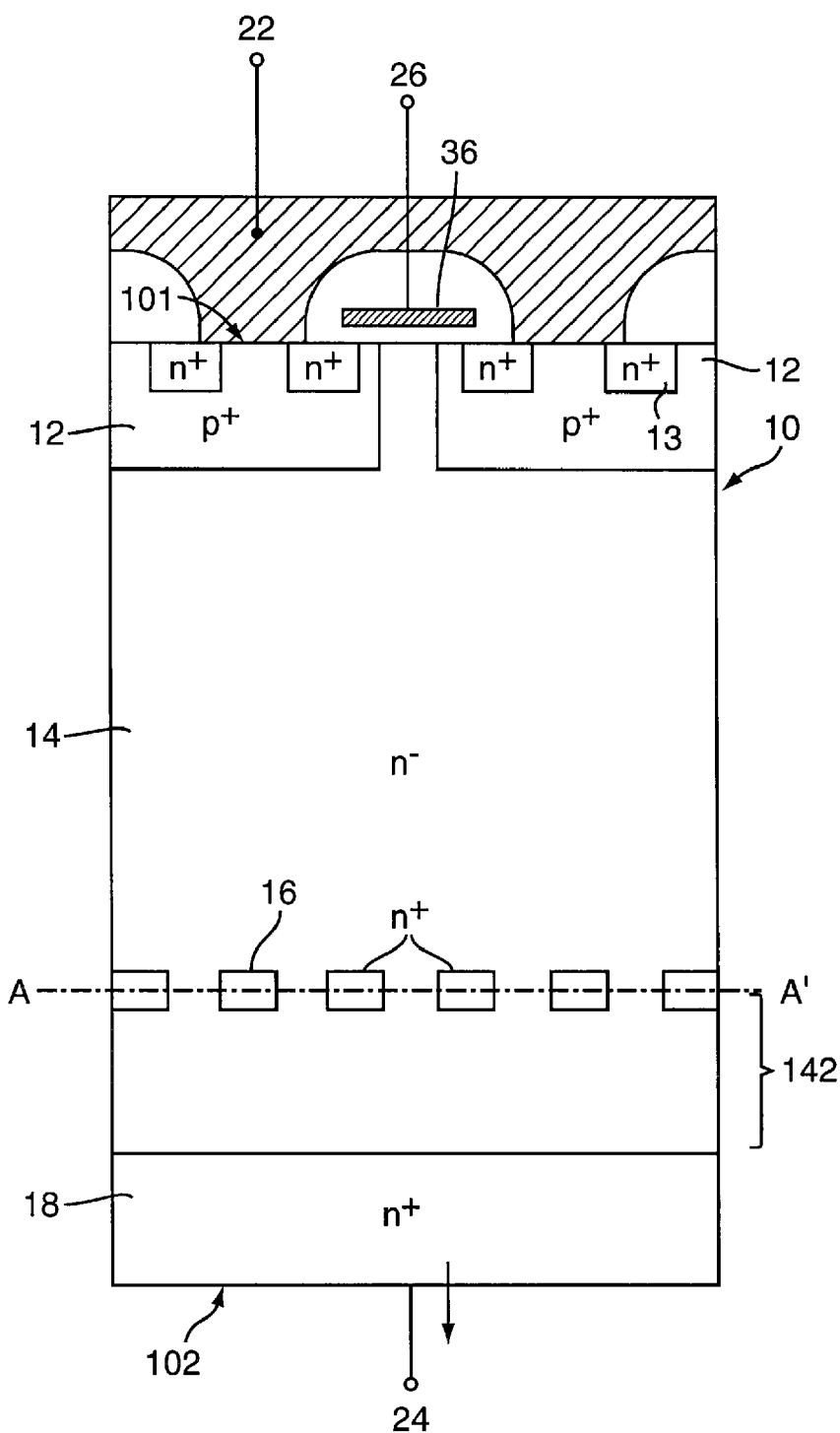
FIG. 3 shows a semiconductor component according to the invention formed as an IGBT.

FIG. 3 shows a semiconductor component according to the invention formed as an IGBT, which differs from the component illustrated in FIG. 2 by the fact that the third semiconductor zone 18 in the region of the rear side of the semiconductor body 10 is p-doped in order to inject minority charge carriers into the drift zone 14 in a known manner when the component is driven into the on state.

FIG. 4 schematically shows the doping profile, i.e. the concentration $N_D$ of donors along the section line A-A' depicted in FIGS. 1 to 3 in the region of the stop zone 16. This doping concentration is high in the region of the sections of the heavily doped stop zone 16 and correspondingly low between said sections. Customary values for the high doping are approximately $10^{16}$ cm$^{-3}$. Customary values for the low doping lie in the range of between $10^{12}$ cm$^{-3}$ and $10^{14}$ cm$^{-3}$.

The width of the sections of the stop zone 16 may approximately correspond to the distance between said sections. However, the distance between said stop zones may also be significantly smaller than the lateral dimensions of the stop zones, as is illustrated in the case of the diode according to the invention in accordance with FIG. 5a.

Figure 5B:
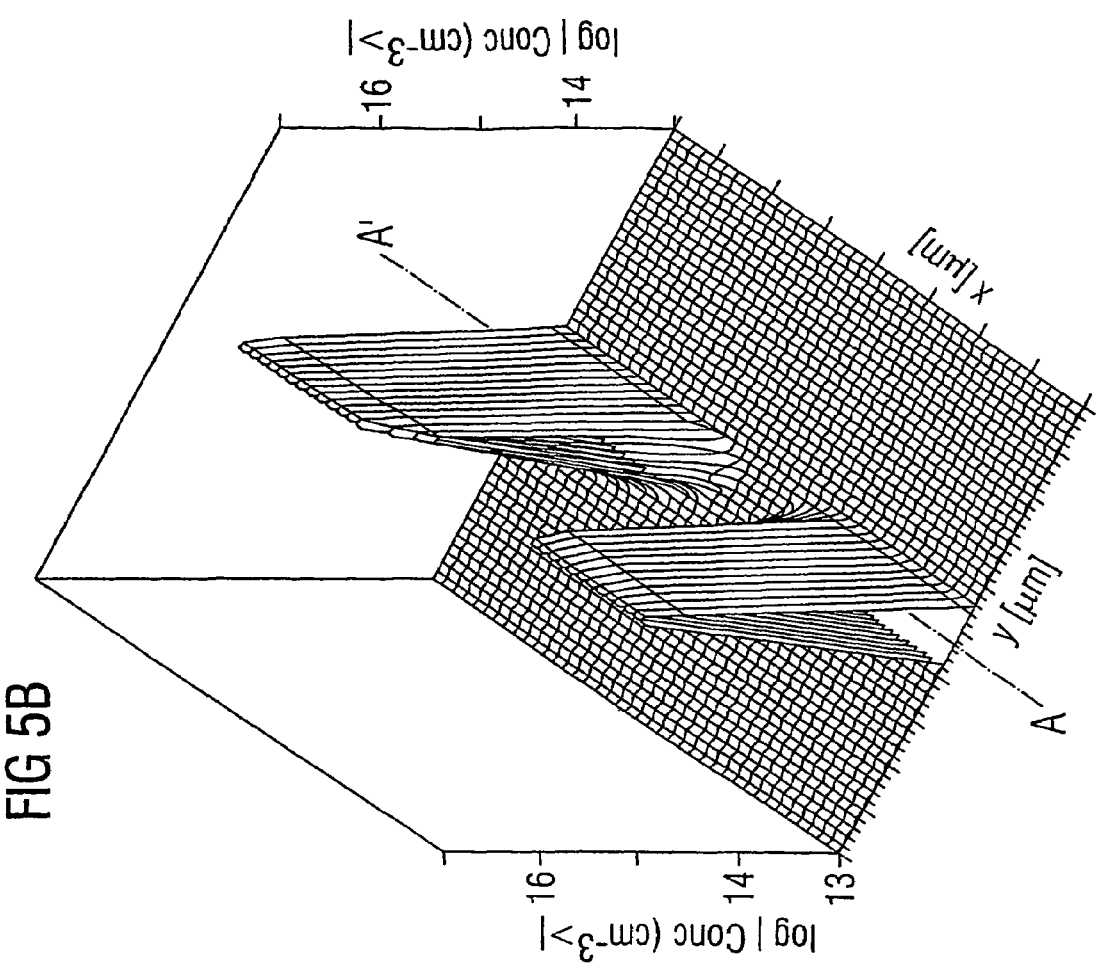
FIG. 5 shows a partial section of a semiconductor component according to the invention formed as a diode (FIG. 5a) and the three-dimensional doping profile in the region of the stop zone (FIG. 5b)
Figure 5A:
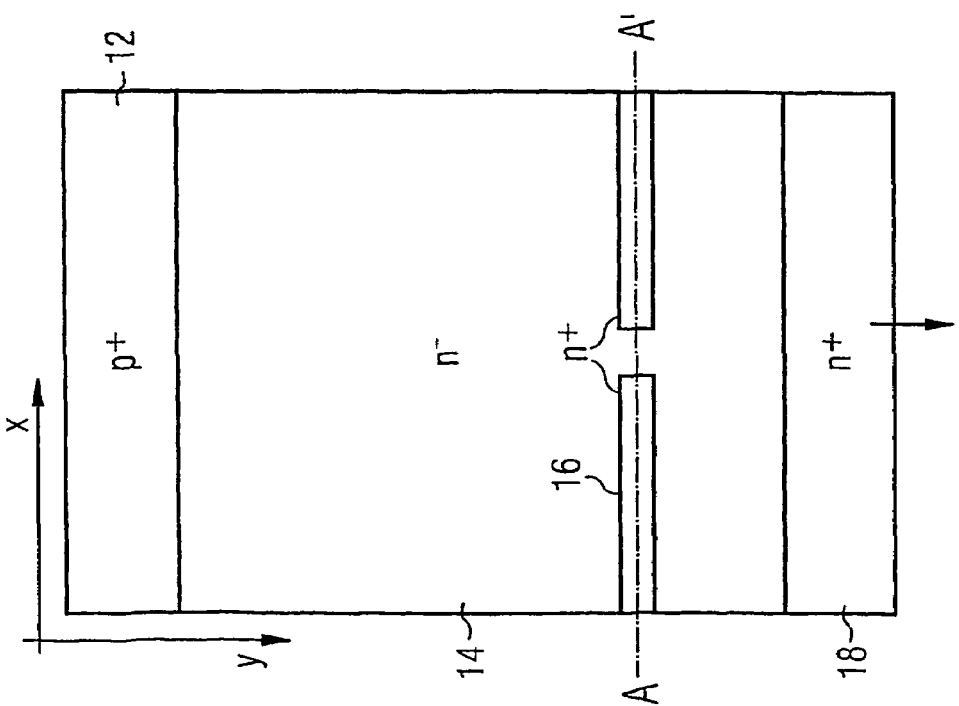

FIG. 5b shows the three-dimensional doping profile in the region of the stop zone 16 in the case of the diode according to FIG. 5a, which reveals that the doping in the region of the stop zone is significantly higher than the doping of surrounding regions. In order to produce the stop zone, provision is made for applying a mask 60 having cutouts 61 to one of the sides of the semiconductor body 10 and for irradiating said side of the semiconductor body with protons. FIG. 6 illustrates this method step, the mask 60 having cutouts 61 being applied to the rear side 102 of the semiconductor body in FIG. 6. Instead of the mask 60, it is also possible to use a metal diaphragm that is positioned on or in front of the rear side 102 of the semiconductor body 10. The irradiation operation takes place in a process stage in which a multiplicity of semiconductor components may still be jointly integrated in a wafer, the metal diaphragm being positioned in a suitable manner in front of the wafer.

The energy with which the protons are radiated into the semiconductor body 10 is chosen such that the protons penetrate in the vertical direction right into the regions in which the individual sections of the stop zone are intended to be formed. These regions right into which the radiated-in protons penetrate are designated by the reference symbol 50 in FIG. 6.

The proton irradiation is followed by a heat treatment method, the temperature and the duration of this heat treatment method being chosen in such a way that irradiation damage in the region through which the protons radiate on their way right into the regions 50 is largely annealed, but that no significant diffusion of the protons radiated into the regions 50 takes place, in order to achieve doped zones which are as far as possible closely delimited and form the individual sections of the later stop zone 16. The n-type doping of these stop zone sections results from hydrogen-induced donors; the radiated-in protons or hydrogen ions themselves do not act in a doping manner.

The irradiation energy with which the protons are introduced into the semiconductor body 10 is chosen in such a way that the zones 50 with the radiated-in protons lie at a desired distance from the more heavily doped third semiconductor zone 18.

The proton irradiation gives rise to crystal defects in the regions of the semiconductor body through which the protons are radiated. These crystal defects lead to a reduction of the charge carrier lifetime, which in turn leads to an increase in the forward voltage of the semiconductor component. Experiments have shown that, at annealing temperatures in the region of 500° C., the charge carrier lifetime present before the irradiation is attained again to an approximation. The temperatures present during the heat treatment step therefore preferably lie in the range between 400° C. and 500° C.

We claim:

1. A semiconductor component comprising:
   a doped first semiconductor zone of a first conduction type,
   a doped second semiconductor zone of a second conduction type, which adjoins the first semiconductor zone and is doped more weakly than the first semiconductor zone,
   a doped third semiconductor zone of the second conduction type, which adjoins the second semiconductor zone and is doped more heavily than the second semiconductor zone,
   a stop zone of the second conduction type, which is arranged in the second semiconductor zone at a distance from the third semiconductor zone, the stop zone being doped more heavily than regions of the second semiconductor zone that surround the stop zone, the distance between the stop zone and the third semiconductor zone being less than the distance between the stop zone and the first semiconductor zone,
   wherein the stop zone is formed in sections, the stop zone having a plurality of zones arranged laterally spaced apart from one another.

2. The semiconductor component as claimed in claim 1, which has at least one field effect structure comprising a zone of the second conduction type, which is arranged in the first semiconductor zone at a distance from the second semiconductor zone, and a control electrode formed in a manner insulated from the semiconductor zones.

3. The semiconductor component as claimed in claim 1, in which the distance between the third semiconductor zone and the first semiconductor zone is more than three times as large as the distance between the stop zone and the third semiconductor zone.

4. The semiconductor component as claimed in claim 1, in which the dimensions of the stop zone in the direction from the first to the third semiconductor zone are significantly smaller than the dimensions of the second semiconductor zone in this direction.

5. A semiconductor component comprising:
   a doped first semiconductor zone of a first conduction type, a doped second semiconductor zone of a second conduction type, which adjoins the first semiconductor zone and is doped more weakly than the first semiconductor zone, a doped third semiconductor zone of the first conduction type, which adjoins the first semiconductor zone and is doped more heavily than the second semiconductor zone, a stop zone of the second conduction type, which is arranged in the second semiconductor zone at a distance from the third semiconductor zone, the stop zone being doped more heavily than regions of the second semiconductor zone that surround the stop zone, the distance between the stop zone and the third semiconductor zone being less than the distance between the stop zone and the first semiconductor zone, wherein the stop zone is formed in sections, the stop zone having a plurality of zones arranged laterally spaced apart from one another, and a field effect structure comprising a zone of the second conduction type, which is arranged in the first semiconductor zone at a distance from the second semiconductor zone, and a control electrode formed in a manner insulated from the semiconductor zones.

6. The semiconductor component as claimed in claim 5, in which the distance between the third semiconductor zone and the first semiconductor zone is more than three times as large as the distance between the stop zone and the third semiconductor zone.

7. The semiconductor component as claimed in claim 5, in which the dimensions of the stop zone in the direction from the first to the third semiconductor zone are significantly smaller than the dimensions of the second semiconductor zone in this direction.

8. A semiconductor component having the following features:

a doped first semiconductor zone of a first conduction type, a doped second semiconductor zone of a second conduction type, which adjoins the first semiconductor zone and is doped more weakly than the first semiconductor zone, doped third semiconductor zone, which adjoins the second semiconductor zone and is doped more heavily than the second semiconductor zone, and a stop zone of the second conduction type, which is arranged in the second semiconductor zone at a distance from the third semiconductor zone, the stop zone being doped more heavily than regions of the second semiconductor zone that surround the stop zone, the distance between the stop zone and the third semiconductor zone being less than the distance between the stop zone and the first semiconductor zone, the stop zone being formed in sections in such a way that it has a plurality of zones arranged laterally spaced apart from one another, and the doping of the stop zone being formed at least partly by hydrogen-induced donors.

9. The semiconductor component as claimed in claim 8, in which the distance between the third semiconductor zone and the first semiconductor zone is more than three times as large as the distance between the stop zone and the third semiconductor zone.

10. The semiconductor component as claimed in claim 8, which has at least one field effect structure comprising a zone of the second conduction type, which is arranged in the first semiconductor zone at a distance from the second semiconductor zone, and a control electrode formed in a manner insulated from the semiconductor zones.

11. The semiconductor component as claimed in claim 8, in which the third semiconductor zone is of the second conduction type.

12. The semiconductor component as claimed in claim 10, in which the third semiconductor zone is of the first conduction type.

13. The semiconductor component as claimed in claim 8, in which the dimensions of the stop zone in the direction from the first to the third semiconductor zone are significantly smaller than the dimensions of the second semiconductor zone in this direction.

\* \* \* \* \*

UNITED STATES PATENT AND TRADEMARK OFFICE
CERTIFICATE OF CORRECTION

PATENT NO. : 7,361,970 B2
APPLICATION NO. : 11/083914
DATED : April 22, 2008
INVENTOR(S) : Barthelmess et al.

It is certified that error appears in the above-identified patent and that said Letters Patent is hereby corrected as shown below:

On the Title page, page 2, in the other publications section, in the printed patent, please change "Electrical" to --"Electrical--

Column 1, line number 11, please change "Aug. 27, 2003" to --Aug. 27, 2003,--

Column 1, line number 13, please change "Sep. 20, 2002" to --Sep. 30, 2002--

Column 1, line 31, please change "thyristors, the" to --thyristors; the--

Column 2, line 5, please change "type," to --type;--

Column 2, line 27, please change "example" to --example,--

Column 2, line 51, please change "DE 102 14 176.2 which" to --DE 102 14 176.2, which--

Column 5, line 16, please change "zones which" to --zones, which--

Column 5, line 17, please change "zone can" to --zone, can--

Column 5, line 31, please change "components) which" to --components), which--

Column 8, line 16, please change "particular the" to --particular, to--

In the specification, in the description of the invention section, column 8, line 21, in the printed patent, please change "example the leads," to --example, the leads,--

UNITED STATES PATENT AND TRADEMARK OFFICE
CERTIFICATE OF CORRECTION

PATENT NO. : 7,361,970 B2
APPLICATION NO. : 11/083914
DATED : April 22, 2008
INVENTOR(S) : Barthelmess et al.

It is certified that error appears in the above-identified patent and that said Letters Patent is hereby corrected as shown below:

Column 9, line 2, please change "zone 16 which" to --zone 16, which--

Column 10, line 44, please change "zone," to --zone, and--

Column 10, line 45, please change "wherein the stop zone is formed in sections" to --a stop zone formed in sections--

Column 11, line 17, please change "wherein the stop zone is formed in sections" to --a stop zone formed in sections--

Signed and Sealed this

Fifteenth Day of July, 2008

JON W. DUDAS
*Director of the United States Patent and Trademark Office*